United States Patent
Iwasawa et al.

[11] Patent Number: 5,281,449
[45] Date of Patent: Jan. 25, 1994

[54] METHOD OF FORMING PATTERN COATINGS BASED ON A RADIATION CURABLE COMPOSITION WHICH CONTAINS A RESIN HAVING BOTH THIOETHER AND CARBOXYL GROUPS

[75] Inventors: Naozumi Iwasawa, Hiratsuka; Hideo Kogure, Atsugi; Heibachi Murase, Kanagawa, all of Japan

[73] Assignee: Kansai Paint Company, Limited, Amagasaki, Japan

[21] Appl. No.: 742,232

[22] Filed: Aug. 8, 1991

[30] Foreign Application Priority Data

Aug. 9, 1990 [JP] Japan .................. 2-212300

[51] Int. Cl.$^5$ .............. B05D 3/06; G03C 1/705; G03F 7/027
[52] U.S. Cl. .................. 427/510; 427/512; 427/515; 427/520; 430/281; 430/286
[58] Field of Search ............ 427/53.1, 54.1, 43.1, 427/508, 510, 511, 515, 512, 520, 553, 554, 555; 430/269, 281, 286, 294, 921

[56] References Cited

U.S. PATENT DOCUMENTS

| | | | |
|---|---|---|---|
| 4,054,682 | 10/1977 | Kuesters et al. | 427/54.1 |
| 4,073,968 | 2/1978 | Miyamoto et al. | 427/511 |
| 4,179,295 | 12/1979 | Takamizawa et al. | 430/281 |
| 4,254,185 | 3/1981 | Buter | 427/388.3 |
| 4,431,723 | 2/1984 | Proskow | 430/281 |
| 4,547,394 | 10/1985 | Herz et al. | 427/54.1 |
| 4,605,590 | 8/1986 | Delseth et al. | 525/343 |
| 4,942,109 | 7/1990 | Koizumi et al. | 430/285 |
| 4,987,054 | 1/1991 | Sondergeld et al. | 430/281 |
| 5,102,775 | 4/1992 | Okuhara et al. | 430/286 |
| 5,196,487 | 3/1993 | Kogure et al. | 525/343 |

*Primary Examiner*—Marianne Padgett
*Attorney, Agent, or Firm*—Armstrong, Westerman, Hattori, McLeland & Naughton

[57] ABSTRACT

The invention provides a method for forming a pattern coating, the method including the steps of: applying to a substrate a radiation curable composition containing a resin (a) which contains, per kilogram of said resin (a) about 1.5 to about 4.5 moles of a polyermizable unsaturated group, about 0.4 to about 2.5 moles of a carboxyl group and 0.2 to about 3.5 moles of a thioether group, the resin having a number average molecular weight of about 500 to about 50,000; selectively irradiating a portion of the applied coating with actinic rays; and subjecting the coating to development with an alkali aqueous solution.

16 Claims, No Drawings

METHOD OF FORMING PATTERN COATINGS BASED ON A RADIATION CURABLE COMPOSITION WHICH CONTAINS A RESIN HAVING BOTH THIOETHER AND CARBOXYL GROUPS

The present invention relates to a method of forming pattern coatings and more particularly to a method of forming pattern coatings suitable for an etching resist, plating resist, solder resist or the like.

Various methods are known for the production of printed wiring boards. In any of these methods, it may be necessary to apply a resist such as etching resist, plating resist, solder resist or the like. During their manufacture, printed wiring boards may be heated or may be contacted with a chemical substance according to the producing method. Thus resists are required to have properties including chemical resistance, adhesion, heat resistance, etc.

With the recent tendency to make finer patterns on printed wiring boards, an increasing number of boards entail difficulty in forming the desired pattern by screen printing. Further, as recently conductor circuits have been made narrower in line width and finer, and through-hole pads have been made narrower, cured resists are apt to have reduced adhesion to these portions. As a result, dry film methods in more cases entail difficulty in forming patterns.

To obviate the problems, development-type liquid resists are drawing attention. But these resists present the problems of insufficient adhesion and, when a highly safe dilute alkali solution is employed as a developer with low heat resistance and chemical resistance.

It is an object of the present invention to provide a method for forming pattern coatings, the method comprising curing a radiation curable composition by irradiation with actinic rays and subjecting the cured composition to development with a highly safe alkali aqueous solution to form a pattern coating which is outstanding in chemical resistance, adhesion, heat resistance, etc.

Other objects and features of the invention will become more apparent from the following description.

According to the invention, there is provided a method for forming a pattern coating, the method comprising the steps of: applying to a substrate a radiation curable composition containing a resin (a) which contains, per kilogram of said resin (a), about 1.5 to about 4.5 moles of a polymerizable unsaturated group, about 0.4 to about 2.5 moles of a carboxyl group and 0.2 to about 3.5 moles of a thioether group, the resin having a number average molecular weight of about 500 to about 50,000; selectively irradiating the required portion of the applied coating with actinic rays; and subjecting the coating to development with a dilute alkali aqueous solution.

According to the method of the invention, a fine pattern can be very easily and highly reliably formed by irradiating only the required portions with actinic rays. Further, the method uses a dilute aqueous solution of alkali as a developer and is therefore excellent in safety. Furthermore, the use of this specific resin results in a coating with an improved adhesion to the substrate and with high heat resistance, high chemical resistance, etc.

The resin (a) is required to contain both thioether and carboxyl groups. Because of the coexisting two groups, the coating forms a chelate bond with the substrate metal and therefore can achieve pronounced improvements in adhesion and chemical resistance.

The thioether and carboxyl groups preferably form a chelate forming group represented by the formula (I) or (II):

wherein $R^1$ and $R^2$ are the same or different and each represent a hydrogen atom or an alkyl group having 1 to 8 carbon atoms; or

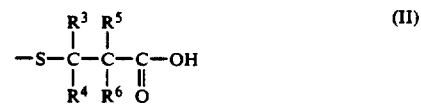

wherein $R^3$, $R^4$, $R^5$ and $R^6$ are the same or different and each represent a hydrogen atom or an alkyl group having 1 to 8 carbon atoms, or form a bivalent o-phenylene group along with two carbon atoms attached thereto.

Typical examples of chelate forming groups represented by the formulae (I) and (II) are

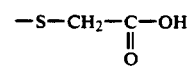

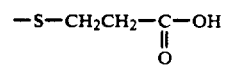

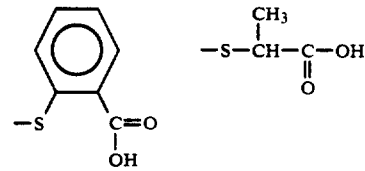

The chelate forming group in the resin (a) is a portion which forms a chelate complex having a stable 5-membered ring (in the case of the chelate forming group of the formula (I)) or six-membered ring (in the case of the chelate forming group of the formula (II)) of the non-ionic intermolecular complex type with a positive bivalent or trivalent metal ion. Models of chelate complexes to be formed are given below wherein the chelate forming group is represented by

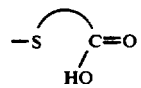

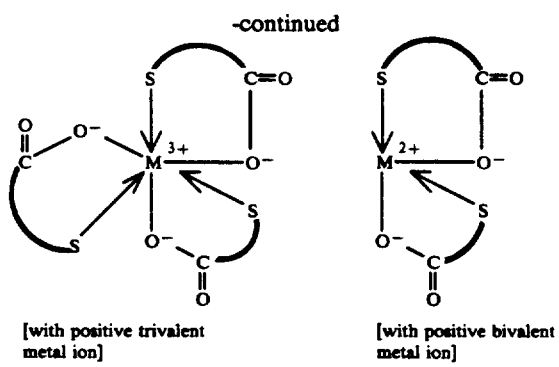

[with positive trivalent metal ion]   [with positive bivalent metal ion]

As shown above, three chelate forming groups combine with a positive trivalent metal ion and two chelate forming groups combine with a positive bivalent metal ion to form a chelate complex of five-membered or six-membered ring in which the charge of the metal ion is neutralized with carboxylate ions. Since the chelate complex is formed with the charge neutralized and is nonionic, the resin is resistant to the flow of corrosion current which causes corrosion to metal. Furthermore, the complex is in the form of a five- or six-membered ring and is therefore structurally stable, which is especially desirable with respect to adhesion and chemical resistance.

The resin (a) contains, per kilogram thereof, about 1.5 to about 4.5 moles, preferably about 2.0 to about 4.0 moles, of polymerizable unsaturated group, about 0.4 to about 2.5 moles, preferably about 0.5 to about 2.0 moles, of carboxyl group, and about 0.2 to about 3.5 moles, preferably about 0.3 to about 3.0 moles, of thioether group.

The resin (a) can be prepared, for example, by methods given below in (1) to (4).

(1) A method wherein a compound represented by the formula (III) or (IV) below is subjected to addition reaction with the polymerizable unsaturated groups of a base resin, the number of the unsaturated groups being n per resin molecule ($n \geq 2$) and the number of the compound being 1 per resin molecule ($1 \leq l \leq n-1$)).

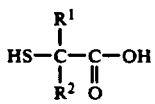

(III)

wherein $R^1$ and $R^2$ are as defined above.

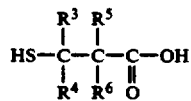

(IV)

wherein $R^3$, $R^4$, $R^5$ and $R^6$ are as defined above.

(2) A method wherein an addition reaction product (B) of a compound having both a polymerizable unsaturated group and a first functional group, such as hydroxyl group, with a compound of the formula (III) or (IV) is reacted with a compound or a resin (A) having second functional groups (the number of second functional groups being n per resin molecule and $n \geq 2$), such as an isocyanato group, which are reactive with the first functional group, in such quantitative ratio that the obtained reaction product contains the second functional group derived from the compound or resin (A), the number of second functional groups being 1 per molecule of the reaction product, provided that $1 \leq l \leq n-1$, and then the reaction product is reacted with a compound (C) having a polymerizable unsaturated group and a first functional group to introduce the polymerizable unsaturated group into the molecule, or a method wherein a mixture of the addition reaction product (B) and the compound (C) is reacted with the compound or resin (A) having second functional groups, namely the method wherein the reaction is conducted in a different order.

(3) A method wherein a compound having a polymerizable unsaturated group and a chelate forming group of the formula (I) or (II) is copolymerized with the polymerizable unsaturated monomer having a first functional group such as hydroxyl group and optionally another polymerizable unsaturated monomer, and the obtained copolymer is reacted with a compound having a polymerizable unsaturated group and a second functional group such as an isocyanato group which is reactive with the first functional group in the copolymer such as hydroxyl group in order to introduce the polymerizable unsaturated group into the copolymer.

(4) A method wherein an addition reaction is conducted between a silane compound or a resin (D) having an etherified silanol group and a polymerizable unsaturated group in the molecule and a compound represented by the formula (III) or (IV) in an amount of less than equivalent relative to the polymerizable unsaturated group, or a method wherein a partial self-condensation reaction is performed using the addition reaction product obtained by the foregoing method or a partial co-condensation reaction is performed between the addition reaction product and a silane compound (E) having etherified silanol groups.

The resin having a plurality of polymerizable unsaturated groups (n in number) per molecule which is used in the method (1) is not specifically limited and can be any of various resins prepared by conventional processes. Such a resin can be prepared, for example, from a resin having a plurality of epoxy groups at a terminal position and/or a side chain (such as a copolymer of glycidyl (meth)acrylate, allyl glycidyl ether or like epoxy-containing polymerizable unsaturated monomer and other polymerizable monomer, or bisphenol-type or like epoxy resin), by addition reaction of (meth)acrylic acid or like carboxyl-containing polymerizable unsaturated compound with the resin to open the epoxy group for the introduction of the plurality of polymerizable unsaturated groups into the resin. This addition reaction can be accomplished, for example, by heating the two reactants at about 50 to about 150° C. for about 30 minutes to about 8 hours in the presence or absence of a catalyst such as a quaternary ammonium salt.

Alternatively, an isocyanate compound containing polymerizable unsaturated groups such as isocyanato-ethyl (meth)acrylate, m-isopropenylphenyl isocyanate or m-isopropenyl-α,α-dimethylbenzyl isocyanate is subjected to an addition reaction with a hydroxyl-containing resin, such as acrylic resin, polyester resin, alkyd resin or epoxy resin to combine the isocyanato groups with the hydroxyl group of the resin for the introduction of the plurality of polymerizable unsaturated groups into the resin. This addition reaction can be effected, for example, by reacting the resin and the compound at about 20 to about 100° C. for about 1 to about 10 hours in the presence or absence of a tin catalyst such as dibutyl tin octylate.

The obtained resin having a plurality of polymerizable double bonds in the molecule is reacted with a compound of the formula (III) or (IV), whereby a chelate forming group represented by the formula (I) or (II) is introduced into the resin. The reaction is conducted in a quantitative ratio that at least one polymerizable double bond per molecule is present in the obtained reaction product. Typical examples of compounds of the formula (III) or (IV) are thiosalicylic acid, thioglycollic acid, 3-mercaptopropionic acid, 2-mercaptopropionic acid and the like. Among them, thiosalicylic acid is desirable since this acid smells less and is easy to handle. The addition reaction of the compound of the formula (III) or (IV) with the polymerizable double bonds of the resin can be conducted, for example, by reacting the reactants at about 20 to about 100° C. for about 1 to about 24 hours in the presence or absence of an amine catalyst.

The method (2) introduces the polymerizable unsaturated group into the resin molecule utilizing the reaction of the first functional group such as hydroxyl group with the second functional group such as isocyanato group simultaneously with or after the introduction of the chelate forming group of the formula (I) or (II).

Examples of combinations of first and second functional groups are hydroxyl-isocyanato, isocyanato-hydroxyl, hydroxyl-acid anhydride, hydroxyl-acid chloride, etc.

The reaction of these functional groups is carried out under known reaction conditions of respective combinations of functional groups.

Examples of the compound or resin (A) having second functional groups which are n in number per molecule (n≧2) are aliphatic diisocyanates such as hexamethylene diisocyanate, trimethylene diisocyanate, 1,4-tetramethylene diisocyanate, pentamethylene diisocyanate, 1,2-propylene diisocyanate, 1,2 - butylene diisocyanate, trimethylhexamethylene diisocyanate, dimer acid diisocyanate, lysine diisocyanate, etc.; alicyclic such as isophorone diisocyanate, 4,4'-diisocyanates methylene-bis (cyclohexylisocyanate), methylcyclohexane-2,4-(or 2,6-) diisocyanate, 1,3- (or 1,4-)di(isocyanatomethyl)cyclohexane, etc.; aromatic diisocyanates such as xylylene diisocyanate, m-xylylene diisocyanate, tetramethylxylylene diisocyanate, tolylene diisocyanate, 4,4'-diphenylmethane diisocyanate, 4,4'-diphenyl diisocyanate, 1,5-naphthalene diisocyanate, 1,4-naphthalene diisocyanate, etc.; heterocyclic diisocyanates such as dianisidine diisocyanate, chlorodiphenylene diisocyanate, 4,4'-diphenyl ether diisocyanate, etc.; polyisocyanates having at least three isocyanate groups in the molecule such as triphenylmethane-4,4', 4"-triisocyanate, 1,3,5-triisocyanato benzene, 2,4,6-triisocyanato toluene, 4,4'-dimethyldiphenylmethane-2,2',5,5'-tetraisocyanate, etc.; adducts obtained by reacting a compound containing active hydrogen, such as ethylene glycol, propylene glycol, 1,4-butylene glycol, trimethylolpropane or pentaerythritol with such a di- or polyisocyanate in the presence of excess isocyanate relative to active hydrogen; and biuret-type adducts of such di- or poly-isocyanates and isocyanurate ring type adducts thereof. Examples of compounds or resins (A) wherein the second functional group is hydroxyl are ethylene glycol, propylene glycol, diethylene glycol, triethylene glycol, tetraethylene glycol, dipropylene glycol, butanediol, 3-methyl-1,2-butanediol, pentanediol, tetramethylene glycol, neopentyl glycol, 1,4-cyclohexanedimethanol, triscyclodecane dimethanol, hydrogenated bisphenol A, hydrogenated bisphenol F, hydroxypivalic acid-neopentyl glycol ester and like dihydric alcohols; trihydric to polyhydric alcohols such as glycerin, trimethylolpropane, trimethylolethane, diglycerin, triglycerin, 1,2,6-hexanetriol, pentaerythritol, dipentaerythritol, sorbitol and mannitol; polylactone polyols obtained by combining ε-caprolactone or like lactone with such alcohols; adduct of bisphenol A with alkylene oxide; vinyl copolymer polyol; polyester polyol; etc.

Examples of useful compound having both a polymerizable unsaturated group and a first functional group such as hydroxyl are 2-hydroxyethyl acrylate, hydroxypropyl acrylate, hydroxybutyl acrylate, 2-hydroxyethyl methacrylate, hydroxypropyl methacrylate, hydroxybutyl methacrylate, adduct of acrylic acid or methacrylic acid with a polyol having an ε-caprolactone chain, allyl alcohol and the like. Examples of like compounds wherein the first functional group is isocyanato are isocyanatoethyl (meth)acrylate, m-isopropenylphenyl isocyanate, m-isopropenyl-α,α-dimethylbenzyl isocyanate, etc. Examples of like compounds wherein the first functional group is acid anhydride are maleic anhydride, itaconic anhydride, etc. Examples of like compounds wherein the first functional group is acid chloride are (meth)acrylic acid chloride, crotonic acid chloride, acid chloride of maleic acid half ester, acid chloride of fumaric acid half ester, etc.

In the case where the first functional group is hydroxyl and the second functional group is isocyanato, an addition reaction is effected between the addition reaction product (B) and/or the compound (C) having hydroxyl group and the compound or resin (A) having isocyanato group in the same conventional manner as done for the reaction of hydroxyl with isocyanato. For example, the reaction is accomplished at about 20 to about 100° C. for about 1 to about 10 hours in the presence or absence of a tin catalyst such as dibutyltin octylate. The addition reaction using other combinations of functional groups can be effected in the conventional manner.

In the method (3), the compound having a polymerizable double bond and a chelate forming group of the formula (I) or (II) can be produced, for example, by a method wherein the hydroxyl group in the addition reaction product of the compound of the formula (III) or (IV) with a 2-hydroxyethyl (meth)acrylate or like hydroxyl-containing unsaturated monomer is combined with a polymerizable double bond-containing monoisocyanate compound such as isocyanato ethyl (meth)acrylate, m-isopropenylphenyl isocyanate, m-isopropenyl-α-α,dimethylbenzyl isocyanate or the like. The reaction between the compound of the formula (III) or (IV) and the hydroxyl-containing unsaturated monomer is conducted for example, by reacting them in equimolar amounts in the presence or absence of an amine catalyst at about 20 to about 100° C. for about 1 to about 24 hours. The obtained addition reaction product has a hydroxyl group(s). The addition reaction between the addition reaction product and the monoisocyanate compound having a polymerizable double bond is conducted, for example, by reacting them in equimolar amounts at about 20 to about 100° C. for about 1 to about 10 hours in the presence or absence of a tin catalyst. The compound having a polymerizable double bond and a chelate forming group of the formula (I) or (II) can be obtained by other methods, for example, by reacting 2 moles of the compound of the formula (III) or (IV) with 2 moles of a hydrocarbon halide having a polymerizable double bond, such as allyl bromide, in the presence of 1 mole of a complex-forming metal salt, such as nickel chloride, and washing the obtained precipitate with an acid.

Examples of the polymerizable unsaturated monomer having a first functional group for use in copolymerization with the compound having a chelate forming group of the formula (I) or (II) and a polymerizable double bond in the method (3) are $C_2$–$C_8$ hydroxyalkyl esters of (meth)acrylic acids such as 2-hydroxyethyl (meth)acrylate and hydroxypropyl (meth)acrylate; hydroxyl-containing unsaturated monomers such as allyl alcohol; and isocyanato-containing unsaturated monomers such as isocyanatoethyl (meth)acrylate and m-isopropenyl-$\alpha$, $\alpha$-dimethylbenzyl isocyanate.

Examples of the polymerizable unsaturated monomer optionally used for copolymerization in the method (3) are $C_1$–$C_{18}$ alkyl esters of (meth)acrylic acids such as methyl (meth)acrylate, ethyl (meth)acrylate, n-butyl (meth)acrylate, isobutyl (meth)acrylate, hexyl (meth)acrylate, 2-ethylhexyl (meth)acrylate and lauryl aromatic vinyl compounds such as styrene, $\alpha$-methylstyrene and vinyl toluene; and vinyl acetate, (meth)acrylamide, (meth)acrylonitrile and N-methylol (meth)acrylamide butyl ether.

The copolymerization of the compound having the chelate forming group and a polymerizable double bond with the above other polymerizable unsaturated monomer can be conducted by a known polymerization method, for example, by heating the two components in the presence of a polymerization catalyst, and preferably in the presence of an organic solvent.

The thus obtained copolymer is reacted with a monomer having a polymerizable unsaturated group and a second functional group which is reactive with the first functional group in the copolymer to introduce the polymerizable unsaturated group into the copolymer. Combinations of first and second functional groups for use in this reaction include those as exemplified above for the reaction in the method (2). The reaction of these reactive groups is conducted under conventional reaction conditions.

Examples of preferred silane compounds or resins (D) having a polymerizable unsaturated group and an etherified silanol group for use in the method (4) are silane compounds represented by the formula (V) below, resins prepared by subjecting one or at least two of such silane compounds to partial condensation, and partial co-condensation products prepared from such a silane compound and other silane compound having an etherified silanol group

(V)

wherein A is an unsaturated hydrocarbon group or unsaturated carbonyloxyalkyl group, X is a hydrogen atom, a hydrocarbon group having 1 to 18 carbon atoms, an alkoxy group having 1 to 18 carbon atoms, an aryloxy group having 6 to 8 carbon atoms or an alicyclic hydrocarbonoxy group having 5 to 8 carbon atoms, and Y and Z are the same or different, each represent an alkoxy group having 1 to 18 carbon atoms, an aryloxy group having 6 to 8 carbon atoms, an alicyclic hydrocarbonoxy group having 5 to 8 carbon atoms and may be the same as X.

Examples of preferred groups A are vinyl, allyl, methacryloyloxyethyl, acryloyloxyethyl, methacryloyloxypropyl, acryloyloxypropyl and like groups.

Among the alkoxy groups having 1 to 18 carbon atoms, aryloxy groups having 6 to 8 carbon atoms and alicyclic hydrocarbonoxy groups having 5 to 8 carbon atoms represented by X, Y and Z, preferable examples are methoxy, ethoxy, propoxy, butoxy, hexoxy, octoxy, methoxyethoxy and like alkoxy groups having 1 to 8 carbon atoms, phenoxy group, cyclohexyloxy group and the like.

Preferable among the hydrocarbon groups represented by X and having 1 to 18 carbon atoms are methyl, ethyl, n-propyl, isopropyl, n-butyl, n-hexyl and like alkyl groups having 1 to 6 carbon atoms; phenyl, methylphenyl, ethylphenyl and like aryl groups having 6 to 8 carbon atoms; and cyclopentyl, cyclohexyl and like alicyclic hydrocarbon groups having 5 to 8 carbon atoms.

Typical examples of silane compounds represented by the formula (V) are vinyltrimethoxysilane, vinyltriethoxysilane, vinyltris(n-propoxy)silane, vinylbis(methoxy)methylsilane, vinylbis(ethoxy)methylsilane, vinylbis(n-propoxy)methylsilane, allyltrimethoxysilane, $\beta$-acryloyloxyethyltrimethoxysilane, $\beta$-methacryloyloxyethyltrimethoxysilane, $\gamma$-acryloyloxypropyltrimethoxysilane, $\gamma$-methacryloyloxypropyltrimethoxysilane, $\gamma$-methacryloyloxypropyl(methyldiethoxy)silane, $\beta$-methacryloyloxyethyltriethoxysilane, $\gamma$-methacryloyloxypropyltriethoxysilane, $\gamma$-methacryloyloxypropyltris(2-methoxyethoxy)silane, $\gamma$-methacryloyloxy(n-butoxy)silane, $\gamma$-methacryloyloxypropyltris(isobutoxy)silane, $\gamma$-methacryloyloxypropyltris(isopropoxy)silane, etc.

The other silane compounds having an etherified silanol group(s) which can be subjected to partial co-condensation with the silane compound represented by the formula (V) include silane compounds having at least two etherified silanol groups. Examples of such compounds are methyltrimethoxysilane, methyltriethoxysilane, phenyltrimethoxysilane, phenyltriethoxysilane, isobutyltrimethoxysilane, isobutyltriethoxysilane, ethyltrimethoxysilane, dimethyldimethoxysilane, diphenyldimethoxysilane, diphenyldiethoxysilane, diisobutyldimethoxysilane, diisobutyldipropoxysilane and like silane compounds, and partial co-condensation products of these silane compounds.

The partial condensation of the silane compound(s) of the formula (V) and the partial co-condensation of the silane compound of the formula (V) and the above-mentioned other silane compound having an etherified silanol group(s) can be conducted by the conventional method of condensation of etherified silane compounds. Generally, these reactions are conducted at room temperature to a temperature of up to the boiling point, preferably by heating the reactants to about 50 to about 90° C. in the presence of water and an acid such as acetic acid or like organic acid or hydrochloric acid or like inorganic acid. The amount of water is suitably variable according to the desired degree of condensation.

In the case where the silane compound or resin (D) has polymerizable unsaturated groups which are n in number per molecule (n≧2), an addition reaction is effected between the compound or resin (D) and the compound of the formula (III) or (IV) such that the obtained addition reaction product contains polymerizable unsaturated groups derived from the silane compound or resin (D), the number of the unsaturated group being 1 per molecule, provided that $1 \leq l \leq n-1$. Alternatively the addition reaction product obtained by the above method is subjected to partial self-condensation or to partial co-condensation with other silane compound (E) having an etherified silanol group. The resin (a) for use in the present invention can be thus prepared.

In the case where the foregoing silane compound or resin (D) has one polymerizable unsaturated group per molecule, an addition reaction is carried out between an m mole of said compound or resin and a p mole of the compound of the formula (III) or (IV) ($1 \leq p \leq m-1$), and further a partial condensation reaction of the obtained adduct is conducted to achieve a condensation degree of m or more, or a partial co-condensation is carried out between the adduct and q mole of the silane compound (E) to achieve a condensation degree of at least m+q, whereby the resin (a) for use in the present invention is obtained.

The addition reaction between the silane compound or resin (D) and the compound of the formula (III) or (IV) can be performed, for example, by reacting the two reactants usually at about 20 to about 100° C. for about 1 to about 24 hours in the presence of an amine catalyst.

The addition reaction product obtained by the foregoing reaction may be used per se as the resin (a) for use in the invention. The resin (a) of the invention can be obtained also by subjecting the addition reaction product to partial condensation or to partial co-condensation to increase the molecular weight or to introduce the polymerizable unsaturated group into the resin molecule for the increase of such groups.

The other silane compound (E) for use in partial co-condensation can be any of those having etherified silanol groups and exemplified above as capable of undergoing partial co-condensation with the silane compound of the formula (V). The partial condensation and partial co-condensation can be carried out by the same method as the partial (co-)condensation already stated.

The resin (a) for use in the invention may be one obtained by a method other than the methods (1) to (4). A suitable molecular weight of the resin (a) is in the range of about 500 to about 50,000, preferably about 1,000 to about 30,000. A preferred resin (a) has at least one of each of thioether groups, carboxyl groups and polymerizable unsaturated groups per molecule.

Various base resins are usable for preparing the resin (a). Examples of such resins are acrylic resins, epoxy resins, polyester resins, silicon-containing resins, etc.

The radiation curable composition for use in the method of the invention may comprise the resin (a) alone or as diluted with an organic solvent, or with a monomer such as a polymerizable unsaturated monomer, a polyvinyl monomer containing at least 2 polymerizable unsaturated groups per molecule, or a mixture thereof, or alternatively as dispersed or dissolved in water after neutralizing the carboxyl groups in the resin (a) with an organic amine, ammonia or like bases. In preparing a radiation curable composition in the form of a solution or dispersion, the monomer is used preferably in an amount of not more than about 50 parts by weight per 100 parts by weight of the resin (a). The amount of the organic solvent or water is not specifically limited insofar as it is adjusted to a viscosity required for application of the composition. A preferred amount is not more than 1,000 parts by weight per 100 parts by weight of the combined amount of the resin and dilute the monomer.

The radiation curable composition used in the present invention may further contain a photopolymerization initiator, coloring pigment, extender pigment, corrosion inhibitive pigment, dye, thermoplastic polymer, polyfunctional vinyl monomer or oligomer, crosslinking agent, leveling agent, defoaming agent, antisagging agent and similar additives.

The photopolymerization initiator is preferably used in curing the radiation curable composition by UV radiation or visible radiation. Useful photopolymerization initiators include those known in the field of resists. Typical examples are benzoin, benzoin methyl ether, benzoin ethyl ether, benzyl, benzyl dimethyl ketal, diphenyl disulfide, tetramethylthiuram monosulfide, diacetyl, eosine, thionine, Michler's ketone, anthracene, anthraquinone, chloroanthraquinone, methylanthraquinone, α-hydroxyisobutylphenone, p-isopropyl-α-hydroxyisobutylphenone, acetophenone, α, α-dichloro-4-phenoxyacetophenone, 1-hydroxy-1-cyclohexylacetophenone, methylbenzoyl formate, 2-methyl-1-[4-(methylthio)phenyl]-2-morpholinopropane, thioxanthone, benzophenone, etc. In curing the composition by exposure to UV or visible light, the photopolymerization initiator is used in an amount of about 0.1 to about 20 parts by weight, more preferably about 0.5 to about 10 parts by weight, per 100 parts by weight of the resin (a).

The coloring pigment, extender pigment, corrosion inhibitive pigment and dye for use herein can be any of those usually used in the field of inks and paints. These additives are used in an amount of up to 75% by weight preferably up to 50% by weight, based on the solids content of the composition for use herein. Examples of useful polyfunctional vinyl monomers or oligomers are trimethylolpropane tri(meth)acrylate, dipentaerythritol (meth)acrylate, norbornene di(meth) acrylate, tricyclodecanedimethanol di(meth)acrylate, etc. These polyfunctional vinyl monomers, oligomers or thermoplastic polymers are used in an amount of preferably up to 30% by weight, based on the solids content of the composition for use herein.

When the resin (a) contains a hydroxyl group, the specific crosslinking agent can be used for the agent and the hydroxyl group to cause crosslinking at room temperature or with heating, in addition to photopolymerization due to the polymerizable double bond. Examples of crosslinking agents useful in such case are a known polyisocyanate compound, blocked polyisocyanate compound, aminoplast resin, i.e., a condensation product of urea, melamine, benzoguanamine or like nitrogen-containing compound with formaldehyde, and lower alkyletherified product of such a condensate (the alkyl having 1 to 4 carbon atoms).

Further, since the resin (a) prepared by the method (4) contains etherified silanol groups which can be subjected to hydrolysis and condensation, the resin (a) can be crosslinked by hydrolysis due to moisture or water and condensation of the silanol groups, besides photopolymerization due to the polymerizable double bond.

According to the method of the invention, the radiation curable composition used in the invention is applied to substrates by spray coating, brush coating, roller coating, dip coating, electrophoretic coating, silkscreen printing or like usual method generally to a thickness of about 10 to about 100 μm when dried. Examples of substrates for use in fabrication of printed wiring boards are base materials laminated with copper foils or similar electroconductive metal foils. Examples of useful base materials include glass fiber reinforced epoxy resins, epoxy-impregnated paper base materials, phenol-impregnated paper base materials, polyimide-type laminated base materials, polyimide films, polyester films, aramide paper, etc. Useful substrates are not limited to the above examples and include metal plates, base materials without a laminate of electroconductive metal foils, etc.

In the case where the applied coating to be cured contains a large amount of organic solvent, water or like diluting agent, the coating is partially cured by selective irradiation of the required portion with actinic rays such as ultraviolet rays, visible rays or electron beams after removal of the diluting agent as by heating. When ultraviolet or visible rays are used as actinic rays, the dose of radiation is in the range of about 5 to about 1,000 mj/cm$^2$, preferably about 20 to about 700 mj/cm$^2$.

The irradiator to be used can be one conventionally used for curing with ultraviolet rays, visible rays or like actinic rays, such as a superhigh-pressure mercury lamp, high-pressure mercury lamp, xenon lamp, metal halide lamp or visible-ray laser.

When electron beams are used as actinic rays, a suitable dose of radiation is in the range of about 1 to about 20 megarads. Usable as electron beam accelerators in irradiation with electron beams are Cockcroft accelerator, Cockcroft-Walton accelerator, van de Graaff type, resonance transformer type, transformer type, insulated core transformer type, dynamitron type, linear filament type, high frequency type and so on.

The selective irradiation of the required portion by setting a photomask over the coating layer, followed by irradiation with ultraviolet rays, visible rays or the like, by depicting the pattern on the coating layer using actinic rays as lasers, by applying electron beams through a metal mask, or by drawing the pattern on the coating layer using electron beams.

The coating layer partially cured by selective irradiation of the required portion is developed with a dilute aqueous solution of alkali to thereby dissolve and remove the uncured portion, whereby a pattern is formed. The dilute alkali aqueous solution contains an alkali in a concentration of about 0.5 to about 3%. Useful alkalis are, for example, sodium hydroxide, sodium carbonate, ammonia, tetramethyl ammonium hydroxide, etc. The development methods are not specifically limited and include various conventional methods. The development is performed, for example, by dipping the coating in a developer at about 20 to about 50° C., preferably about 25 to about 35° C., for about 20 to about 300 seconds or by spraying a developer to the coating under pressure of about 0.5 to about 3 kg/cm$^2$.

In the case where the coating cured with radiation contains a crosslinking agent which, when heated after development, causes crosslinking reaction with functional groups, such as hydroxyl, in the resin, the crosslinking density of the coating can be improved and the coating can be strengthened by heating the coating, for example, at about 80 to about 180° C. for about 10 to about 60 minutes, after development.

According to the present invention, the cured coating forms a chelate bond with a substrate metal due to the presence of the thioether group and carboxyl group with the result that the coating is given a high adhesion to the substrate and a high chemical resistance, and a fine pattern of high reliability can be formed by numerous kinds of methods of forming patterns. Consequently the method of the invention is suited for forming etching resist for use in forming a circuit by a substract method, additive method or solder plating method, forming plating resist having a pattern on various metal platings or forming a solder resist or like protective coating having a pattern.

EXAMPLES

The present invention will be described below in more detail with reference to the following examples.

In the following examples, parts and percentages are all by weight unless otherwise specified.

PREPARATION EXAMPLE 1

A 300 parts quantity of 1-methoxy-2-propanol was placed into a flask and heated to 100° C.

| | |
|---|---|
| Methyl methacrylate | 150 parts |
| Acrylic acid | 250 parts |
| Styrene | 50 parts |
| 2-Hydroxyethyl methacrylate | 50 parts |
| Azobisisobutyronitrile | 30 parts |

A liquid mixture of the foregoing ingredients was added dropwise to the contents of the flask over a period of 3 hours and the resulting mixture was maintained at the same temperature for 4 hours, giving a solution of acrylic resin.

Thereafter, a mixture of the following ingredients was fed to the flask:

| | |
|---|---|
| Glycidyl methacrylate | 426 parts |
| Hydroquinone | 0.08 part |
| Tetraethylammonium bromide | 0.8 part |

The resulting mixture was heated at 100° C. for 10 hours, giving a solution of a carboxyl group-containing unsaturated acrylic resin.

To the solution thus obtained was added a mixture of 154 parts of thiosalicylic acid and 580 parts of 1-methoxy-2-propanol, and the resulting mixture was reacted at 70° C. for 12 hours, giving a resin solution A.

With respect to the solution thus obtained, it was confirmed that SH groups of thiosalicylic acid attached to the carboxyl group-containing unsaturated acrylic resin and that no SH group remained in the thiosalicylic acid by means of a color reaction using 5,5'-dithiobis(2-nitrobenzoic acid).

The solids content of the obtained solution was about 50%, and the resin obtained had a molecular weight of about 13,000 [number average molecular weight determined by gel permeation chromatography (hereinafter referred to as "GPC")] and contained, per solids content of the resin, 1.85 moles/kg of polymerizable unsaturated group, 0.93 mole/kg of thioether group and 1.35 moles/kg of carboxyl group.

PREPARATION EXAMPLE 2

A 245 parts quantity of methyl isobutyl ketone was fed to a flask and heated to 50° C. Nitrogen gas was introduced into the flask to replace the air and a mixture of the following ingredients was placed into the flask:

| | |
|---|---|
| 2-Hydroxyethyl acrylate | 116 parts |
| Thioglycolic acid | 92 parts |
| Triethylamine | 1.8 parts |

After addition of the mixture, the resulting mixture was heated at 50° C. for 5 hours and then heated at 80° C. for 1 hour for reaction, giving a hydroxyl group-containing solution a.

While introducing air into the flask in place of nitrogen, a mixture of the following ingredients was added to the solution obtained above:

| | |
|---|---|
| Compound represented by the formula | 201 parts |

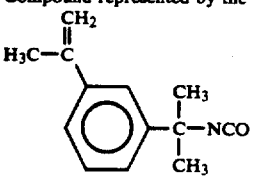

| | |
|---|---|
| Dibutyltin diacetate | 0.2 part |
| Hydroquinone | 0.02 part |

After addition of the above mixture, the resulting mixture was heated at 70° C. for 5 hours while introducing air into the flask. Thereafter, the obtained mixture was heated at 80° C. for 3 hours, giving a solution of a polymerizable unsaturated group-containing compound. The solids content of the solution obtained was about 60%. The main structure of the above compound was represented by the formula

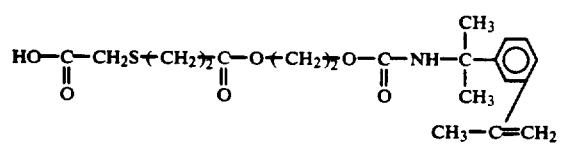

A 58.7 parts quantity of methyl isobutyl ketone was placed into another flask, heated to 90° C. and maintained at the same temperature while introducing nitrogen gas into the flask. To the contents of the flask was added dropwise a homogeneous liquid mixture of the following monomers and polymerization initiator over a period of 4 hours:

| | |
|---|---|
| Solution of a polymerizable unsaturated group-containing compound obtained above and having a solids content of about 60% | 40 parts |
| Hydroxyethyl acrylate | 30 parts |
| Styrene | 10 parts |
| Acrylic acid | 10 parts |
| n-Butyl acrylate | 26 parts |
| 2,2'-Azobisisobutyronitrile | 1.5 parts |

After addition of the mixture, one-half quantity of a mixture of 30.8 parts of toluene and 1.0 part of 2,2'-azobis-2,4-dimethylvaleronitrile was added dropwise at the same temperature over a period of 1 hour. The temperature of the resulting mixture was raised to 100° C., and the remaining half quantity of the mixture was added dropwise thereto over a period of 1 hour. After the addition, the mixture obtained was maintained at the same temperature for 1 hour and then cooled, followed by addition of 50 parts of dimethoxyethane, giving a resin solution.

To the resin solution were added 38 parts of isocyanatoethyl methacrylate, 0.05 part of dibutyltin acetate and 0.001 part of hydroquinone. While introducing air into the flask, the resulting mixture was heated at 50° C. for 8 hours, giving a resin solution B. The solids content of the obtained resin solution was about 54%. The resin obtained had a molecular weight of about 34,000 (number average molecular weight determined by GPC) and contained, per solids content of the resin, 1.77 moles/kg of polymerizable unsaturated group, 0.44 mole/kg of thioether group and 1.44 moles/kg of carboxyl group.

PREPARATION EXAMPLE 3

In 500 parts of 2-butoxyethanol was dissolved 500 parts of Epikote 180S70 (product of Yuka Shell Epoxy Co., Ltd., cresol novolak-type epoxy resin having a molecular weight of about 1,000 and an epoxy equivalent weight of about 200). While maintaining the resulting solution at 100° C., the following ingredients were added to the solution:

| | |
|---|---|
| Acrylic acid | 180 parts |
| Tetrabutylammonium chloride | 0.7 part |
| Monomethoxy hydroquinone | 0.01 part |

The resulting mixture was reacted for 10 hours, giving an unsaturated resin solution. A 115.5 parts quantity of thiosalicylic acid was added to the solution obtained above, and the mixture thus obtained was further heated at 100° C. for 4 hours, giving a resin solution C. The solids content of the obtained resin solution was about 61/5%. The resin obtained had a molecular weight of about 1,600 (number average molecular weight determined by GPC) and contained, per solids content of the resin, 2.2 moles/kg of polymerizable unsaturated group, 0.94 mole/kg of thioether group and 0.945 mole/kg of carboxyl group.

PREPARATION EXAMPLE 4

A 402 parts quantity of 1-methoxy-2-propanol was placed into a flask and nitrogen gas was introduced into the flask to replace the air. Thereafter, the following mixture of ingredients were added:

| | |
|---|---|
| γ-Methacryloyloxypropyl trimethoxysilane | 248 parts |
| Thiosalicylic acid | 154 parts |
| Triethylamine | 3.0 parts |

After the addition of the above mixture, the resulting mixture was sitted and then heated at 50° C. for 5 hours while introducing nitrogen gas into the flask. Thereafter, the mixture obtained was reacted by heating at 80°0 C. for 1 hour, giving a silane solution having a solids content of about 50%. The main structure of the silane was represented by the following formula:

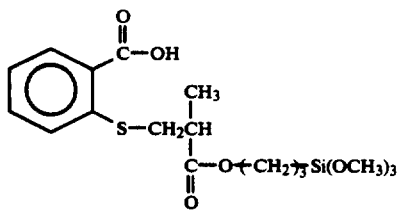

Then, the following ingredients were placed into the flask:

| | |
|---|---|
| Silane solution having a solids content of about 50% | 402 parts |
| γ-Methacryloyloxypropyl trimethoxysilane | 372 parts |
| Phenyltrimethoxysilane | 148.5 parts |
| Isobutyltrimethoxysilane | 133.5 parts |
| Deionized water | 100 parts |
| Toluene | 1000 parts |
| Concentrated hydrochloric acid | 2 parts |
| Hydroquinone | 0.1 part |

The mixture obtained was reacted at 80° C. for 3 hours. While removing the solvent, the temperature was gradually raised. When the amount of the removed solvent reached 1,000 parts, the heating was terminated. The obtained mixture was cooled, followed by addition of 200 parts of ethanol, giving a resin solution D. The resin solution thus obtained had a solids content of about 38%. The obtained resin had a molecular weight of about 7,000 (number average molecular weight determined by GPC) and contained, per solids content of the resin, 2.90 moles/kg of polymerizable unsaturated group, 0.96 mole/kg of thioether group and 0.96 mole/kg of carboxyl group.

PREPARATION EXAMPLE 5

For Comparison

A 300 parts quantity of 1-methoxy-2-propanol was fed to a flask and heated to 100° C. To the contents of the flask was added dropwise a liquid mixture of the following ingredients over a period of 3 hours:

| | |
|---|---|
| Methyl methacrylate | 175 parts |
| Acrylic acid | 225 parts |
| Styrene | 50 parts |
| 2-Hydroxyethyl methacrylate | 50 parts |
| Azobisisobutyronitrile | 30 parts |

The resulting mixture was maintained at the same temperature for 4 hours, giving an acrylic resin solution.

To the resin solution thus obtained was added a mixture of the following ingredients:

| | |
|---|---|
| Glycidyl methacrylate | 284 parts |
| Hydroquinone | 0.06 part |
| Tetraethylammonium bromide | 0.8 part |

The mixture obtained was reacted at 100° C. for 10 hours and then 484 parts of 1-methoxy-2-propanol was added, giving an unsaturated acrylic resin solution E. The obtained resin solution had a solids content of about 50%. The resin obtained had a molecular weight of about 12,000 (number average molecular weight determined by GPC) and contained, per solids content of the resin, 2.55 moles/kg of polymerizable unsaturated group and 1.43 moles/kg of carboxyl group.

PREPARATION EXAMPLE 6

For comparison

A 80 parts quantity of methyl isobutyl ketone was placed into a flask. While introducing nitrogen gas into the flask, methyl isobutyl ketone was heated to 90° C. and maintained at the same temperature. A liquid mixture of the following ingredients was added dropwise thereto over a period of 4 hours:

| | |
|---|---|
| Hydroxyethyl acrylate | 30 parts |
| Acrylic acid | 14 parts |
| Styrene | 36 parts |
| n-Butyl acrylate | 20 parts |
| Azobisisobutyronitrile | 1.5 parts |

After the addition, one-half quantity of a mixture of 30.8 parts of toluene and 1.0 part of 2,2'-azobis-2,4-dimethylvaleronitrile was added dropwise at the same temperature over a period of 1 hour. The temperature was raised to 100° C. and the other half quantity of the mixture was added dropwise over a period of 1 hour. After the addition, the resulting mixture was maintained at the same temperature for 1 hour and then cooled, followed by addition of 50 parts of dimethoxyethane, giving a resin solution.

To the resin solution were added 38 parts of isocyanatoethyl methacrylate, 0.05 part of dibutyltin acetate and 0.001 part of hydroquinone. While introducing air into the flask, the resulting mixture was heated at 50° C. for 8 hours, giving an unsaturated resin solution F. The resin solution thus obtained had a solids content of about 55%. The resin obtained had a molecular weight of about 30,000 (number average molecular weight determined by GPC) and contained, per solids content of the resin, 1.84 moles/kg of polymerizable unsaturated group and 1.41 moles/kg of carboxyl group.

Using the resin solutions A to F obtained in Preparation Examples 1 to 6 in the amounts listed in Table 1, radiation curable compositions of Production Examples 1 to were obtained.

EXAMPLE 1 TO 5 AND COMPARISON EXAMPLES 1 AND 2

One percent palladium chloride solution was applied to a laminated board formed from a glass fiber-reinforced epoxy resin and the board was dried, giving a substrate. To the substrate was applied each of the radiation curable compositions obtained in Production Examples 1 to 7 by means of a bar coater (in Production Examples 2 to 6) or by spraying (in Production Examples 1 and 7) to a dry film thickness of 15 to 18 μm. The coated substrates were heated at 80° C. for 10 minutes to remove the solvent. Then a negative-type photomask having a pattern of line/space=75 μm/75 μm was adhered to the coated surface. The coated substrate was irradiated through the photomask at a dose of 100 mj/cm$^2$ with an ultra-high pressure mercury lamp. Using a 1% aqueous solution of sodium carbonate, development was conducted by spraying the developing solution at a pressure of 1.5 kg/cm$^2$ and 30 to 35° C. for 60 seconds, washing with deionized water and drying at 80° C. for 10 minutes to give the substrate with a resist pattern coating. Each substrate was then immersed in a electroless plating bath maintained at 80° C. for 30 hours for copper plating (composition of the bath (aqueous solution): copper sulfate: 0.04 mole/l, formalin: 0.06 mole/l, sodium salt of EDTA: 0.1 mole/l, pH = 12-12.5), giving a circuit-board.

The resist coating was observed and the state thereof was evaluated with the unaided eye after the development and after the electroless plating. Table 2 shows the results.

EXAMPLE 9

A board for forming a resist pattern coating was obtained in the same manner as in Example 6 with the exception of using the composition of Production Example 13 shown in Table 3 as a radiation curable composition.

A metal mask formed from chromium and having a

TABLE 1

| Production Example No. | Resin solution | | Photopolymerization initiator | | Others | |
| --- | --- | --- | --- | --- | --- | --- |
| | Kind | Amount (part) | Kind | Amount (part) | Kind | Amount (part) |
| 1 | A | 100 | α-Hydroxyisobutylphenone | 2.5 | Triethylamine | 5 |
| | | | | | Deionized water | 50 |
| 2 | B | 100 | Benzophenone | 2 | Methyl ethyl ketone | 50 |
| 3 | C | 100 | 2-Methyl-1-[4-methylthio-phenyl]-2-morphorinopropane | 1.5 | Methyl ethyl ketone | 50 |
| 4 | D | 100 | Benzophenone | 3 | Methyl ethyl ketone | 50 |
| 5 | D | 100 | Benzoin ethyl ether | 1 | Methyl ethyl ketone | 50 |
| 6 | E | 100 | α-Hydroxyisobutylphenone | 2.5 | Triethylamine | 5.3 |
| | | | | | Deionized water | 50 |
| 7 | F | 100 | Benzophenone | 2.0 | Methyl ethyl ketone | 50 |

TABLE 2

| | | Radiation curable composition (Production Example No.) | State of resist coating after development | State of resist coating after electroless plating |
| --- | --- | --- | --- | --- |
| Example | 1 | Production Example 1 | Satisfactory | Satisfactory |
| | 2 | Production Example 2 | Satisfactory | Satisfactory |
| | 3 | Production Example 3 | Satisfactory | Satisfactory |
| | 4 | Production Example 4 | Satisfactory | Satisfactory |
| | 5 | Production Example 5 | Satisfactory | Satisfactory |
| Comp. Ex. | 1 | Production Example 6 | About 15% of the width of the line of the resist pattern decreases | Resist coating peels and circuit pattern can not be formed |
| | 2 | Production Example 6 | Satisfactory | Resist coating partly peels and a number of short circuits occurred |

EXAMPLES 6 TO 8 AND COMPARISON EXAMPLES 3 AND 4

The resin solutions prepared in Preparation Examples in the amounts listed in Table 3 were dispersed by a ball mill for 8 hours, giving colored radiation curable compositions of Production Examples 8 to 12.

Glass-epoxy laminated boards were used each of which have a pattern consisting of copper and formed from line/space=75 μm/75 μm and which have a through-hole of a diameter of 0.6 mmφ with 0.3 mm width through-hole pad around it. To each substrate was applied each of the radiation curable compositions obtained in Production Examples 8 to 12 by silk screen (in Production Examples 8, 9 and 11) or by spraying (in Production Examples 10 and 12). The coated substrates were heated at 80° C. for 10 minutes to remove the solvent, giving boards for forming resist patterns.

A photomask was adhered to the coated surface of the board, the pattern of the photomask being designed so that a portion of 5 mm length of the electrically conductive lines from the open ends, the through-holes and the through-hole pads were made remaining unexposed, followed by irradiation at a dose of 500 mj/cm² with an ultra-high pressure mercury lamp. Thereafter, development was conducted using a 1% aqueous solution of sodium carbonate and the board was heat-treated at 140° C. for 20 minutes, giving a board with the resist pattern coating formed thereon.

The obtained board with the resist pattern coating formed thereon was subjected to various tests with the results shown below in Table 4.

pattern designed the same as that of Examples 6 to 8 was adhered to the coated surface of the board and this surface was irradiated with 7 Mrad of electron beam produced by the Cockcroft-Walton's electron beam-producing apparatus. The development was conducted using a 1% aqueous solution of sodium carbonate, giving a board with the resist pattern coating formed thereon.

The board with the resist pattern coating formed thereon was subjected to various tests with the results shown in Table 4.

The test methods were as follows.

Test Methods

The state of the resist pattern coating after development: Evaluated with the unaided eye Resistance to plating with solder: An aqueous flux was applied to the surface of the board with a resist pattern coating formed thereon. Thereafter, the coated board was subjected to a cycle repeatedly and checked, after each cycle, for the peeling or swelling of the resist coating from the interface between resist-coated and -uncoated portions, one cycle consisting of immersing the coated board in a solder plating bath maintained at 280° C. for 30 seconds, withdrawing the board from the bath and cooling the same.

Resistance to gold plating: A substrate with a resist pattern coating formed thereon was immersed, over a period of 5 minutes, in a plating bath for gold plating maintained at 25° C. and consisting predominantly of an aqueous solution of potassium gold cyanide and the plated board was checked for the peeling or swelling of the resist coating from the interface between resist-coated and -uncoated portions.

TABLE 3

| Production Example No. | Resin solution Kind | Amount (part) | Photopolymerization initiator Kind | Amount (part) | Crosslinking agent Kind | Amount (part) |
|---|---|---|---|---|---|---|
| 8 | A | 100 | α-Hydroxyisobutylphenone<br>Benzophenone | 1.5<br>1.0 | Triglycidyl isocyanurate | 10 |
| 9 | D | 100 | Benzoin ethyl ether | 1 | CYMEL 301 (Note 1) | 10 |
| 10 | A | 100 | α-Hydroxyisobutylphenone<br>Benzophenone | 1.5<br>1.0 | Triglycidyl isocyanurate | 10 |
| 11 | E | 100 | α-Hydroxyisobutylphenone<br>Benzophenone | 1.5<br>1.0 | Triglycidyl isocyanurate | 10 |
| 12 | E | 100 | α-Hydroxyisobutylphenone<br>Benzophenone | 1.5<br>1.0 | Triglycidyl isocyanurate | 10 |
| 13 | C | 100 | — | — | Triglycidyl isocyanurate | 15 |

| Production Example No. | Pigment Kind | Amount (part) | Others Kind | Amount (part) |
|---|---|---|---|---|
| 8 | Barium sulfate<br>Cyanine green | 50<br>0.5 | Methyl ethyl ketone | 100 |
| 9 | Barium sulfate<br>Cyanine green | 50<br>0.5 | Methyl ethyl ketone | 100 |
| 10 | Barium sulfate<br>Cyanine green | 50<br>0.5 | Triethylamine<br>Deionized water | 5<br>100 |
| 11 | Barium sulfate<br>Cyanine green | 50<br>0.5 | Methyl ethyl ketone | 100 |
| 12 | Barium sulfate<br>Cyanine green | 50<br>0.5 | Triethylamine<br>Deionized water | 5.3<br>100 |
| 13 | Barium sulfate<br>Cyanine green | 50<br>0.5 | Methyl ethyl ketone | 100 |

(Note 1) CYMEL 301: a methylated melamine resin manufactured by Mitsui Cyanamide Co., Ltd.

TABLE 4

| | | Readiation curable composition (Production Example No.) | State of resist coating after development | Resistance to plating with solder | Resistance to plating with gold |
|---|---|---|---|---|---|
| Example | 6 | Production Example 8 | Satisfactory | Satisfactory (10 cycles) | Satisfactory |
| | 7 | Production Example 9 | Satisfactory | Satisfactory (10 cycles) | Satisfactory |
| | 8 | Production Example 10 | Satisfactory | Satisfactory (10 cycles) | Satisfactory |
| | 9 | Production Example 13 | Satisfactoyr | Satisfactory (10 cycles) | Satisfactory |
| Comp. Ex. | 3 | Production Example 11 | Satisfactory | The resist coating partly peels after 5 cycles | The resist coating partly peels |
| | 4 | Production Example 12 | Satisfactory | The resist coating wholly peels after 5 cycles | The resist coating wholly peels |

We claim:

1. A method for forming a pattern coating comprising:
applying to a metal containing substrate a radiation curable composition, thereby forming a coating, said radiation curable composition containing a resin (a) whose molecule contains, per kilogram of said resin (a), about 1.5 to about 4.5 moles of a polymerizable unsaturated group, about 0.4 to about 2.5 moles of a carboxyl group and 0.2 to about 3.5 moles of a thioether group, the resin having a number average molecular weight of about 500 to about 50,000, said carboxyl and said thioether groups forming a chelate forming group represented by the formula

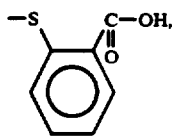

such that a chelate bond is formed between said chelate forming group and said metal containing substrate;

selectively irradiating a portion of the applied coating with actinic rays, thereby curing said portion; and then
subjecting the coating to development with an alkali aqueous solution.

2. A method according to claim 1 wherein the radiation curable composition contains a photopolymerization initiator in an amount of about 0.1 to about 20 parts by weight per 100 parts by weight of the resin (a).

3. A method according to claim 1 wherein the resin (a) contains, per kilogram of said resin (a), about 2.0 to about 4.0 moles of said polymerizable unsaturated group, about 0.5 to about 2.0 moles of said carboxyl group, and bout 0.3 to about 3.0 moles of said thioether group.

4. A method according to claim 1 wherein resin (a) is prepared by subjecting thiosalicylic acid to addition reaction with a precursor resin containing said polymerizable unsaturated group, said polymerizable unsaturated group being present in an amount n per precursor resin molecule (n>2) and the thiosalicylic acid being used in an amount l per precursor resin molecule $(1 \leq l \leq n-1)$.

5. A method according to claim 1, wherein said rein (a) is prepared by
(i) reacting a first compound having both said polymerizable unsaturated group and a first functional group with thiosalicylic acid to form an addition reaction product (B), (ii) reacting said addition reaction product (B) with a second compound or resin (A) to obtain a reaction product L, said second compound or resin (A) either having a second functional group, said second functional group being present in an amount n per molecule, with n>2, said second functional group being reactive with said first functional group, said second functional group being present in said reaction product L in an mount l per molecule, provided that $1 \leq l \leq n-1$, and then (iii) reacting said reaction product L with a third compound (C) having said polymerizable unsaturated group and said first functional group to introduce said polymerizable unsaturated group into said reaction product L.

6. A method according to claim 1 wherein said resin (a) is prepared by reacting a copolymer with a second compound, (i) said copolymer being prepared by copolymerizing
(1) a first compound having (a) said polymerizable unsaturated group and said chelate forming group represented by the formula

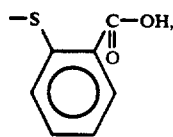

with (2) a monomer containing said polymerizable unsaturated group and also having a first functional group (ii) said second compound having said polymerizable unsaturated group and a second functional group which is reactive with said first functional group in said copolymer.

7. A method according to claim 1 wherein said resin (a) is prepared by an addition reaction between a silane compound or resin (D) either having an etherified silanol group and said polymerizable unsaturated group and thiosalicylic acid in a amount less than equivalent relative to said polymerizable unsaturated group.

8. A method according to claim 7 wherein said silane compound is represented by formula (V) below, and said resin (D) is prepared by subjecting at least one of said silane compound to partial condensation or by subjecting said silane compound and another silane compound having an etherified silanol group to partial co-condensation, wherein said formula (V) is represented by:

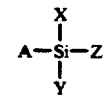 (V)

wherein A is an unsaturated hydrocarbon group or unsaturated carbonyloxyalkyl group, X is a member selected from the group consisting of a hydrogen atom, a hydrocarbon group having 1 to 18 carbon atoms, an alkoxy group having 1 to 18 carbon atoms, an aryloxy group having 6 to 8 carbon atoms and an alicyclic hydrocarbonoxy group having 5 to 8 carbon atoms, and Y and Z are the same or different, with each being selected from the group consisting of an alkoxy group having 1 to 18 carbon atoms, an aryloxy group having 6 to 8 carbon atoms and an alicylic hydrocarbonoxy group having 5 to 8 carbon atoms, such that Y and Z may be the same as X.

9. A method according to claim 5 wherein an ordered pair of said first and second functional groups is at least one pair selected from the group consisting of hydroxyl-isocyanato, isocyanatohydroxyl, hydroxyl-acid anhydride and hydroxyl-acid chloride.

10. A method according to claim 5 wherein the first functional group is a hydroxyl group and the second functional group is an isocyanato group.

11. A method according to claim 6, wherein said first compound and said monomer containing said polymerizable unsaturated group are copolymerized with a second monomer having a second polymerizable unsaturated group.

12. A method according to claim 1, wherein said rein (a) is prepared by (i) reacting a first compound having both said polymerizable unsaturated group and a first functional group with thiosalicylic acid to form an addition reaction product (B);

(ii) mixing said addition reaction product (B) with a third compound (C) also having said polymerizable unsaturated and said first functional groups, thereby producing a mixture;

(iii) reacting said mixture with a second compound or resin (A) having second functional groups, said second functional groups being present in an amount n per molecule, with n>2, said second functional groups being reactive with said first functional groups.

13. A method according to claim 7, further including a partial self-condensation reaction which is performed using said addition reaction product.

14. A method according to claim 7, further including a partial co-condensation reaction which is performed between said addition reaction product and a plane compound (E) having etherified silanol groups.

15. A method according to claim 6, wherein an ordered pair of said first and second functional groups is at least one pair selected from the group consisting of hydroxyl-isocyanato, isocyanato-hydroxyl, hydroxyl-acid anhydride and hydroxyl-acid chloride.

16. A method according to claim 6, wherein the first functional group is a hydroxyl group and the second functional group is an isocyanato group.

* * * * *